United States Patent [19]

Dugger

[11] 3,933,573
[45] Jan. 20, 1976

[54] ALUMINUM NITRIDE SINGLE CRYSTAL GROWTH FROM A MOLTEN MIXTURE WITH CALCIUM NITRIDE

[75] Inventor: Cortland O. Dugger, Newton, Mass.

[73] Assignee: The United States of America as represented by the Secretary of the Air Force, Washington, D.C.

[22] Filed: Mar. 27, 1975

[21] Appl. No.: 563,008

Related U.S. Application Data

[63] Continuation-in-part of Ser. No. 419,459, Nov. 27, 1973, abandoned.

[52] U.S. Cl. ............... 156/624; 23/300; 23/296; 23/305 A; 423/412
[51] Int. Cl.$^2$ ............... C01F 7/00; B01J 17/06
[58] Field of Search ........ 23/305 A, 301 R, 301 SP, 23/300; 156/624, 619, 604; 423/412, 111, 122

[56] References Cited
UNITED STATES PATENTS
3,450,499   6/1969   Yates ............................. 423/412

OTHER PUBLICATIONS
Taylor et al., Journal of the Electrochemical Society, Apr. 1969, "Some Properties of AlN", pp. 308 to 314.
Cox et al., J. Phys. Chem. Solids, 1967, "On the Preparation, Optical Properties and Electrical Behavior of AlN", Vol. 28, pp. 543 to 548.

*Primary Examiner*—Norman Yudkoff
*Assistant Examiner*—S. J. Emery
*Attorney, Agent, or Firm*—Joseph E. Rusz; William J. O'Brien

[57] ABSTRACT

A method for growing single crystals which utilizes calcium nitride as a solvent system in the molten solution growth of bulk aluminum nitride crystals.

4 Claims, No Drawings

ALUMINUM NITRIDE SINGLE CRYSTAL GROWTH FROM A MOLTEN MIXTURE WITH CALCIUM NITRIDE

STATEMENT OF GOVERNMENT INTEREST

The invention described herein may be manufactured and used by or for the Government for governmental purposes without the payment of any royalty thereon.

BACKGROUND OF THE INVENTION

This application is a continuation-in-part of Ser. No. 419,459, filed Nov. 27, 1973, now abandoned.

This invention relates to a method for growing crystalline materials. More particularly, this invention concerns itself with molten solution growth method for synthesizing aluminum nitride crystals.

In an even more specific sense, this invention contemplates the utilization of calcium nitride as a high temperature solvent for use in the recrystallization of refractory aluminum nitride, that is, growing single crystals of aluminum nitride from a molten solution containing the refractory material as the solute, and calcium nitride as the solvent. Crystallization is accomplished by the precipitation or crystallization of the solute, the solute being the desired crystal, from the molten solution.

Recent advances in the utilization of single crystals for a wide variety of purposes, especially in various electronic surveillance and detection applications, has generated considerable research in the development of improved techniques for growing single crystalline materials. A problem has arisen, however, in that many of the methods relied upon heretofore fail to grow crystals having a reproducibly high quality.

The growth of nitride crystals, especially as equi-three dimensional single crystals, has proven to be a most difficult task since the reproduction of large numbers of crystals, all possessing the high quality needed for detection applications, has not been attained by prior art methods. However, if proper utilization of crystalline materials is to be made, then crystals of reproducibly good quality must be made.

Large, water white aluminum nitride single crystals have never been grown from its melt because of the following reasons. First, aluminum nitride sublimes and decomposes according to the reaction $2AlN(s) = 2Al(g) + N_2(g)$ at temperatures far below (c.a. 1723°K) the temperature range (3023°K) in which AlN is reported to melt. Secondly, materials that could be used as crucible materials to contain aluminum nitride in its melting temperature range are violently attacked, particularly under high pressures. Thirdly, the state of materials science, as far as crystal growth is concerned, has not developed high pressure chamber materials capable of sustaining pressures greater than 100 atmospheres for long periods (3 weeks) at elevated temperatures (2000°C). It is highly improbable, therefore, that in the near future, large, good quality aluminum nitride single crystals will be grown from its own melt at least by present day techniques.

Aluminum nitride single crystals, therefore, have been generally grown by vapor techniques. These two major techniques are: the sublimation reaction, i.e., $2AlN(s) = 2 Al(g)+N_2(g)$ and the chemical vapor transport reaction, i.e., $2AlCl_3(g) + N_2(g)+3H_2(g) = 2 AlN(s) + 6 HCl (g)$.

The approximate thermodynamic relation, which must be controlled in these reactions so as to enhance "good" crystal growth is d ln P/d T for each gaseous element, molecule or compound. The Clausius-Clapeyron equations can be used to determine this relation. In using the vapor techniques, it is important that differences do not exist between the partial pressure of the reacting species and that of the aluminum nitrides. Water-white aluminum nitride single crystals can be grown reproducibly by the vapor techniques; however, one of the major disadvantages of these methods is that aluminum nitride single crystals have only been grown as microscopic sized "two-dimensional" crystals heretofore. A two-dimensional crystal is defined as a crystal whose dimensions have a l/d ratio greater than 7, i.e., 0.3 mm long × 0.03 mm diameter (l/d=10); or the shape of the crystal is "platy," i.e., large surface area but only microns (50–100)thick.

In using a mass spectrometer to study the vaporazation of aluminum nitride, only the gaseous species Al and $N_2$ were detected. The vaporization proceeds according to the reaction:

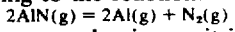

No gaseous aluminum nitride compound was detected.

Disregarding kinetic factors, the probable reason why vapor grown aluminum nitride single crystals are two-dimensional in shape, is because of the relatively low binding energies of gaseous metal nitrides and the very high stability of the nitrogen molecule. Condensed nitrides vaporize primarily by decomposition to the elements. Substances such as the nitrides, which decompose to diatomic gaseous molecules, might be expected to have low condensation coefficients (fraction of the incident molecules which stick, or condense, on the vaporizing surface) presumably because nitrogen "prefers" to exist as a gaseous molecule than a nitride ion in the condensed state. This is especially true for aluminum nitride, where the N-N internuclear distance, which is 1.1A in the gaseous $N_2$ molecule, undergoes considerable change in the condensation process; the distance of closest approach of the two nitrogen atoms is about 2.5A in the BN lattice and 3.1 A in AlN lattice.

It is clear, therefore, that any attempt to synthesize bulk aluminum nitride crystals, by conventional means, either from the melt (growth of a pure substance from its own melt) or by vapor techniques using present-day crystal growth facilities, would not be a successful endeavor.

Since most chemical reactions occur in solution and because of the inadequacies of the other crystal growth methods previously discussed, it was found that the molten solution growth technique was the best method to grow bulk aluminum nitride single crystals.

Ideally, a solution is a homogeneous mixture which consists of the solute and solvent constituents. For this, the purpose of this invention, a solvent is a liquid (molten) which is present in excess over all other components of the solution. A solute is the constituent which is dissolved by the solvent. The constituent can consist of one or more compounds of the solvent, but the solute is of a different chemical concentration than the solvent. Or, the solute can consist of components different from the components of the solvent.

Simplistically, solution growth is the precipitation of a solute from solution. More specifically, it is the attempted controlled crystallization (growth rate) of a single grain (crystal) of the solute from solution. The growth rate of good quality single crystals from solution depends on statistical thermodynamic and kinetic factors, i.e., the probability of an atom or an ion of the solute finding its optimal low energy site and the "speed" of attachment of the atoms or ions on the existing single crystal. The thermodynamic and kinetic factors are generally influenced by the type of solution and the degree of solubility of the solute in the solution; the solubility generally being controlled by the temperature of the solution. A given temperature of the solution can create a supersaturation of the solute in the solution. In order for the solution to maintain a minimum free energy at that temperature, some of the solute crystallizes out of solution and thus lowers the saturation of the solute remaining in solution. The degree of supersaturation can be changed by other means, such as the evaporation of the solvent, or by changes in the pressure of the solution. The conventional way of influencing the supersaturation in solution growth, however, is by the change of the solution temperature.

Aluminum nitride is a refractory material and it was difficult to find a suitable solvent which possesses most of the following desirable properties: (1) A high solvent power. (2) Intermediate melting point (1200°–1600°C). (3) Low viscosity. (4) Low vapor pressure and toxicity. (5) Easy separation from AlN single crystals at room temperature. (6) Common ion. (7) A physical solvent, which is primarity covalently bonded. (8) Isomorphous to aluminum nitride without solid solution formation. (9) Does not react with the crucible. In accordance with this invention, the best solvent was found to be calcium nitride ($Ca_3N_2$). This compound was chosen because: (1) is possesses a common nitride ion. (2) of its reported low melting point of 1195°C. (3) $Ca_3N_2$ easily dissolves twenty mole percent (6.5 wt % AlN at 1600°C). (4) The calcium ion ($Ca^{2+}$) would be too large to enter the AlN lattice. (5) Of high crystallographic symmetry (cubic). (6) Of very easy separation from aluminum nitride single crystals at room temperature. The viscosity of molten $Ca_3N_2$ is not known, but the molten $Ca_3N_2$-AlN solution appears to be quite fluid.

Calcium nitride, which is 65% ionically bonded, as computed by Pauling's equation $P = I\text{-exp}\ [-0.25\ (x_A-x_B)^2]$ for the relation between the electronegativity difference ($x_A-x_B$) and the amount of partial ionic character (P) for single bonds, demonstrates at three crystal structures; $\alpha Ca_3N_2$ from room temperature to about 500°C, and $\beta\ Ca_3N_2$ from 500°C to 1150° and possibly $\gamma\ Ca_3N_2$ from 1150°C to 1200°C. The $\alpha\ Ca_3N_2$ is pseudo-hexagonally structured with the lattice constants a = 3.553A and c = 4.11A and c/a ratio = 1.16. Its density (x-ray) = 2.72 gm/cm³. $\beta\ Ca_3N_2$ belongs to the cubic system. Its x-ray density is 2.66 gm/cm³ and its lattice constant is a = 11.38A. Gamma $Ca_3N_2$ which is orthohomic, has a density of 2.63 gm/cm³. The lattice constants have not been determined.

The molecular weight of $Ca_3N_2$, which is 148.25 gm/mole consists of 60 mole percent calcium (81.05 wt. %) and 40 mole percent nitrogen (18.95 wt. %). The heat formation of $Ca_3N_2$ is 151.2 Kcal/mole at 298°K, and the compound is formed by the reaction of calcium and nitrogen at elevated temperatures (400°C approximately).

With this invention, it has been found that the problem of melt homogeneity that occurs when growing crystals with prior known techniques can be drastically minimized by a modification that involves the use of calcium nitride as a solvent system. The implementation of the modification of this invention provides a technique for growing reproducibly high quality AlN crystals in a manner not heretofore achieved with previously known techniques.

SUMMARY OF THE INVENTION

In accordance with this invention, it has been found that aluminum nitride single crystals of reproducibly good quality and large size can be grown by a novel technique that involves the use of calcium nitride as a solvent system in the solution growth of these crystals.

In general, the method involves the use of calcium nitride ($Ca_3N_2$) as a solvent for aluminum nitride at elevated temperatures. Aluminum nitride is dissolved by calcium nitride and then recrystallized from solution as a single crystal. The synthesis of single crystals by this method is known as the Solution Growth Method. For example, to synthesize the aluminum nitride material as a crystal, the general procedure is to intimately mix from about 8 to 40 mole percent aluminum nitride (AlN) and from about 92 to 60 mole percent calcium nitride. The mixture is heated in an appropriate crucible to a temperature above the melting point of the mixture which is generally in the range of about 1525°C to 1650°C. After the temperature of the molten solution is maintained from one to two hours, the solution temperature is slowly cooled to a temperature slightly below its saturated solubility temperature at a programmed rate of from about 0.5°C/hr. to about 3°C/hr.

The invention provides a method which achieves a reproducible crystallization of aluminum nitride from a molten solution heated to intermediate temperatures of from 1125°C to 1800°C. The nitride common ion, which is uniformly distributed throughout the solution, insures the homogeneity of the molten solution. Solution homogeneity promotes the synthesis of high quality aluminum nitride single crystals. It appears to provide the best method for reproducibly synthesizing high optical quality crystalline aluminum nitride at atmospheric pressures and intermediate temperatures or, alternatively, at low temperatures (approx. 500°C) and high pressures (approx. 1.5Kb). It has been used to reproducibly grow aluminum nitride as equi-three dimensional single crystals. These Aluminum nitride single crystals are urgently needed to fulfill a number of surveillance and detection applications.

Accordingly, the primary object of this invention is to provide a novel and simplified method for growing aluminum nitride single crystals of high optical quality.

Another object of this invention is to provide a method for growing aluminum nitride single crystals that can reproducibly make crystals of high quality.

Still another object of this invention is to utilize calcium nitride as a solvent system in the solution growth method of synthesizing aluminum nitride single crystals.

A further object of this invention is to provide a method for synthesizing aluminum nitride crystals that are mechanically sound, substantially free from defects and possess the necessary overall high quality that permits their use in detection and surveillance devices.

Still further objects, advantages and features of the present invention will become readily apparent upon consideration of the following detailed description thereof.

DESCRIPTION OF THE PREFERRED EMBODIMENT

With the above-defined and other objects in view, the present invention contemplates the use of calcium nitride as a solvent system in the solution growth method of synthesizing aluminum nitride single crystals. The growth of a single crystal from a molten solution is effected by the precipitation or crystallization of the solute (the desired crystalline end product) from the solution. The solution consists of solute component and the molten solvent component, which in this case is calcium nitride. The molten solvent component is considered to dissolve the solute component under the specified reaction conditions encompassed within the scope of the invention. The precipitation or crystallization of the crystal from the solution is in turn brought about by the technique of slowly cooling the molten solution over a period of time at a predetermined rate or by any other technique which could be used to grow single crystals from solution. The temperature of the molten solution is cooled at a programmed cooling rate to maintain a slight supersaturation of the solute in the molten solution. The slight supersaturation of the solute in the molten solution is the driving force which enhances crystallization. The rate of crystal growth is primarily a function of the change of the solute solubility with temperature, the cooling rate, the total mass of the solution, the molecular weight of the solute and the densities of the crystal (solute) and the molten solution. It is the proper supersaturated state at the growing crystal face which is the major problem in solution growth. Supersaturation is an unstable condition, therefore, in order to grow high quality, large single crystals by the solution technique, conditions must be found which insures a continual replenishment of the supersaturation of the solute in the solution as the crystal grows as well as the successful transfer of the supersaturated solution to the crystal growing faces. The technique of this invention, the details of which will be pointed out in the examples to follow, has proven to be a successful method of attaining high quality crystals.

With the foregoing discussion in mind, there are presented herewith detailed examples which illustrate specific embodiments of the invention and the manner in which the invention is carried out.

EXAMPLE 1

Aluminum nitride single crystals have been repeatedly grown by the general prescription of intimately mixing approximately 20 volume percent aluminum nitride and 80 volume percent calcium nitride. The measurement and mixing of the ingredients is performed in a helium atmosphere. The mixture, while still in the helium atmosphere, is then placed in a previously outgassed carbon crucible which is sealed by a threaded carbon cap. The crucible is transferred to a furnace chamber which is capable of being pressurized or evacuated. The screwed carbon cap is removed and the chamber is immediately evacuated to $10^{-3}$ Torr. The chamber is then filled with high purity helium to atmospheric pressure; evacuated again to $10^{-3}$ Torr; back-filled with helium to atmospheric; evacuated a third time, and finally back-filled with helium to 50 psig.

An RF generator is turned on and, through induction heating, the carbon crucible is slowly heated to approximately 900 C. The carbon crucible is then drawn through the coil at an approximate rate of a half inch per hour. This is done to allow absorbed waters and "impurities" to be removed from the mixture.

The generator power is gradually reduced and finally turned off. At room temperature, the helium pressure is returned to atmospheric pressure and the furnace chamber opened. The carbon cap is tightly screwed on and following the chamber evacuations and refills, the carbon crucible is raised to 1535°C. After one hour, the carbon crucible is again very slowly drawn through the RF coil so that a slightly super saturated solution is created as the solution temperature is slowly cooled. Supersaturation of the solution is the main driving force which enhances crystallization. The withdrawal rate varys such that three quarters of the length of the crucible can be passed through the "hot" zone of the coil as fast as desired or as slow as 0.005 inches per hour. The average rate of withdrawal of this invention was 0.080 inches per hour. Under these conditions, 0.75 mm long × 0.5 mm diameter sized aluminum nitride single crystals have been reproducibly synthesized.

EXAMPLE 2

Aluminum nitride single crystals were also grown in the same manner as shown in Example 1 from a 20 mole percent aluminum nitride and 80 mole percent calcium nitride molten solution. The solution was contained in a nitrogen filled, sealed molydenum crucible. The solution temperature, initially at 1610°C, was cooled 3°C/hour for 30 hours.

EXAMPLE 3

Aluminum nitride crystals were also grown in the same manner as in Examples 1 and 2 from a 15 mole percent aluminum nitride and 85 mole percent calcium nitride molten solution. This solution was contained in a helium filled, sealed tungsten crucible. The solution temperature initially at 1550°C, was cooled about 2°C/hour for 26 hours.

In Table I, there is presented approximate solubility data for aluminum nitride in calcium nitride using graphite crucibles.

TABLE I

| AlN Mole fraction | Temperature °K | °C |
|---|---|---|
| 0.09 | 1468 | 1195 |
| 0.12 | 1503 | 1230 |
| 0.15 | 1525 | 1252 |
| 0.22 | 1728 | 1455 |
| 0.30 | 1883 | 1610 |
| 0.40 | 2086 | 1813 |

Mole Percent (Mol % = Mole fraction × 100)

While the invention is described with reference to a specific embodiment, it is to be expressly understood, particularly by those skilled in the art of synthesizing materials, that many variations in the synthesis of the crystalline materials of this invention may be made in form and detail without departing from the spirit and scope of the invention as defined by the appended claims.

What is claimed is:

1. A method for growing aluminum nitride single crystals which comprises the steps of forming a mixture of (a) from about 8 to 40 mole percent of aluminum nitride, and (b) from about 92 to 60 mole percent calcium nitride; heating said mixture to a temperature above about 1525°C. and maintaining said temperature for a time sufficient to form a homogeneous molten solution thereof; slowly cooling the molten solution to a temperature above its freezing point at a rate of about 0.5° to about 3.0°C./hr. in order to effect the precipitation of single crystals of said aluminum nitride.

2. A method in accordance with Claim 1 wherein said mixture is composed of about 20 mole percent aluminum nitride and 80 mole percent calcium nitride; and said mixture is heated to a temperature of about 1535°C and then slowly cooled at a rate of about 3°C per hour for 30 hours.

3. A method in accordance with claim 1 wherein said mixture is composed of about 20 mole percent aluminum nitride and 80 mole percent calcium nitride; and said mixture is heated to a temperature of about 1610°C and cooled at a rate of about 3°C per hour for 30 hours.

4. A method in accordance with claim 1 wherein said mixture is composed of about 15 mole percent aluminum nitride and 85 percent calcium nitride; and said mixture is heated to a temperature of about 1550°C and cooled at a rate of about 2°C per hour for 26 hours.

* * * * *